(12) United States Patent
Kitch

(10) Patent No.: US 7,381,638 B1
(45) Date of Patent: Jun. 3, 2008

(54) FABRICATION TECHNIQUE USING SPUTTER ETCH AND VACUUM TRANSFER

(75) Inventor: Vassili Kitch, San Ramon, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/143,513

(22) Filed: Jun. 1, 2005

Related U.S. Application Data

(62) Division of application No. 10/144,974, filed on May 13, 2002, now Pat. No. 6,927,160, which is a division of application No. 09/328,864, filed on Jun. 9, 1999, now abandoned.

(51) Int. Cl.
*H01L 21/4763* (2006.01)

(52) U.S. Cl. ............ 438/637; 438/626; 438/627; 438/631; 438/633; 438/639; 438/643; 438/645; 438/675; 438/687; 438/690; 438/692; 438/695; 438/696; 257/E21.575; 257/E21.583; 257/E21.584; 257/E21.585; 257/E21.587

(58) Field of Classification Search ........... 438/626, 438/627, 631, 633, 637, 639, 643, 645, 675, 438/687, 690, 692, 695, 696; 257/E21.575, 257/E21.583, E21.584, E21.585, E21.587
See application file for complete search history.

(56) References Cited

U.S. PATENT DOCUMENTS

| | | | | |
|---|---|---|---|---|
| 3,911,579 A | 10/1975 | Lane et al. | ............ | 30/346.54 |
| 4,521,286 A | 6/1985 | Horwitz | ............ | 204/192 |
| 4,643,629 A | 2/1987 | Takahashi et al. | ............ | 414/331 |
| 4,675,096 A | 6/1987 | Tateishi et al. | ............ | 204/298 |
| 4,818,359 A | 4/1989 | Jones et al. | ............ | 204/298 |
| 5,089,442 A | 2/1992 | Olmer | ............ | 432/235 |
| 5,455,194 A | 10/1995 | Vasquez et al. | ............ | 437/67 |
| 5,877,078 A | 3/1999 | Yanagida | ............ | 439/612 |
| 5,933,756 A | 8/1999 | Fuse | ............ | 438/640 |
| 5,969,422 A | 10/1999 | Ting et al. | ............ | 257/762 |
| 5,985,762 A * | 11/1999 | Geffken et al. | ............ | 438/687 |
| 6,010,603 A * | 1/2000 | Ye et al. | ............ | 204/192.35 |
| 6,136,680 A * | 10/2000 | Lai et al. | ............ | 438/597 |
| 6,174,800 B1 * | 1/2001 | Jang | ............ | 438/629 |
| 6,218,303 B1 | 4/2001 | Lin | ............ | 438/687 |
| 6,271,121 B1 | 8/2001 | Webb | ............ | 438/627 |
| 6,287,968 B1 | 9/2001 | Yu et al. | ............ | 438/675 |
| 6,287,977 B1 * | 9/2001 | Hashim et al. | ............ | 438/722 |
| 6,350,694 B1 * | 2/2002 | Chang et al. | ............ | 438/692 |
| 6,376,355 B1 * | 4/2002 | Yoon et al. | ............ | 438/618 |
| 6,440,844 B1 | 8/2002 | Takagi et al. | ............ | 438/637 |
| 6,812,141 B1 * | 11/2004 | Gaidis et al. | ............ | 438/637 |

* cited by examiner

*Primary Examiner*—Michelle Estrada
*Assistant Examiner*—Jarrett J Stark
(74) *Attorney, Agent, or Firm*—Ronald J. Meetin

(57) ABSTRACT

First material (106) is situated on the surface of a substructure (100 and 102) and in an opening (104), such as a Wench, that extends partway through the substructure. Second material (108) is situated on the first material in the opening. A physical sputter etch is performed on the structure while it is in a sputter etch module (206) to remove the parts of the first material overlying the substructure's surface and situated above the opening and to remove part of the second material overlying the first material in the opening so that remaining parts of the first and second materials are situated in the opening. The so-modified structure is transferred from the sputter etch module under a substantial vacuum, normally via a transfer module (202), to a deposition module (203, 204, or 205) where a layer of third material is deposited over the substructure's surface and over the parts of the first and second materials in the opening.

28 Claims, 4 Drawing Sheets

US 7,381,638 B1

FABRICATION TECHNIQUE USING SPUTTER ETCH AND VACUUM TRANSFER

CROSS-REFERENCE TO RELATED APPLICATIONS

This is a division of U.S. patent application Ser. No. 10/144,974, filed 13 May 2002, now U.S. Pat. No. 6,927,160 B1, which is a division of U.S. patent application Ser. No. 09/328,864, filed 9 Jun. 1999, now abandoned.

BACKGROUND OF THE INVENTION

1. Field of the Invention

The present invention relates to semiconductor circuit manufacturing and, more specifically, to fabricating copper interconnects in an integrated circuit.

2. Discussion of the Related Art

The active devices of an integrated circuit are interconnected through the use of multilevel interconnects to form functional circuits and components. An example of a technique of forming such interconnects in a multilevel-interconnect system is shown in FIGS. 1 and 2.

FIG. 1 shows an aluminum layer 14 blanket deposited over a silicon dioxide layer 12 which is deposited over a substrate 10. Aluminum layer 14 is then etched by using conventional photolithography to form interconnects 16, as shown in FIG. 2.

Copper is a better conductor material than aluminum because of a lower resistivity, thus allowing higher current densities. Copper also shows a better electromigration resistance. However, copper cannot be etched conventionally. Copper damascene technology has thus been developed for forming copper interconnects.

A conventional copper damascene process is described in reference to FIGS. 3 through 7. FIG. 3 shows a dielectric layer 32 deposited over a substrate 30. Dielectric layer 32 is then etched using conventional photolithography to form trenches 34, as shown in FIG. 4. FIG. 5 shows a diffusion barrier 36 formed over dielectric layer 32 and into trenches 34. Next, a copper layer 38 is deposited over diffusion barrier 36, as shown in FIG. 6.

FIG. 7 shows removal of metals by chemical mechanical polishing (CMP) from dielectric layer 32, except from trenches 34, and formation of interconnects 40 and 41. The portion of diffusion barrier 36 on top of dielectric layer 32 is also removed during the copper CMP process. Because the CMP rate for copper is three times or more higher than the CMP rate for diffusion barrier 36, a phenomenon called dishing results, as shown at the top surfaces of interconnects 40 and 41. Dishing is said to occur when the interconnects exhibit varied topography, e.g., in cross section 44 of interconnect 40, outer edges 43 have higher topography than central portion 45. Dishing is undesirable because thinner copper lines cause undesirable higher current density.

An additional problem caused by polishing off the portion of diffusion barrier 36 on top of dielectric layer 32 during the CMP process is heavy oxidation of the top surface of remaining copper layer 38 due to the oxidizing effect of CMP chemistry, and copper exposure to air. The oxidized copper undesirably increases via resistance. A further concern is contamination of dielectric layer 32 after the portion of diffusion barrier 36 on top of dielectric layer 32 is polished off because copper tends to migrate into the exposed dielectric layer 32.

FIGS. 8 through 12 illustrate double damascene technology which is an extension of the copper damascene process described above. FIG. 8 shows a dielectric layer 48, a nitride layer 50, and a dielectric layer 52 deposited in sequence over the structure of FIG. 7.

A resist (not shown) is deposited and patterned to define contact regions. Dielectric layer 48, nitride layer 50 and second dielectric layer 52 are then etched to form vias 54, as shown in FIG. 9. The resist is removed. A second resist (not shown) is deposited and patterned to define interconnect regions. Dielectric layer 52 is etched selectively with respect to nitride layer 50, forming trenches 56, as shown in FIG. 10. FIG. 11 shows a diffusion barrier 58 blanket deposited over the structure of FIG. 10 and into vias 54 and trenches 56. A copper layer 60 is then deposited over diffusion barrier 58.

FIG. 12 shows formation of interconnects 62 and 63 after CMP and the resulting dishing shown by regions 64 and 66, respectively. Interconnects 62 and 63 exhibit worse dishing than that of interconnects 40 and 41, respectively, due to the cumulative effect of dishing. The accumulated dishing causes significant variation in subsequent damascene structure as more metal layers are formed. As a consequence, the aspect ratio, which is defined as the width over the height of the vias, decreases, thereby reducing the process window.

What is needed is a method to fabricate a copper interconnect which does not exhibit dishing, oxidized copper and contaminated dielectric.

SUMMARY OF THE INVENTION

The present invention provides a method of forming copper interconnects that do not exhibit dishing, oxidized copper and contaminated dielectric. A dielectric layer provided above a substrate is etched to form a trench that defines an interconnect region. A diffusion barrier is formed over the patterned dielectric layer and into the trench. A copper layer is then deposited over the diffusion barrier. A first portion of the copper layer is removed by chemical mechanical polishing (CMP) until the top surface of the diffusion barrier is exposed. A sputter etch removes (a) the material of the diffusion barrier overlying the dielectric layer and (b) the oxidized top surface of the copper layer to form a copper interconnect. The sputter etch prevents copper diffusion into the dielectric layer because, by uniformly removing (a) the material of the diffusion barrier overlying the dielectric layer and (b) the oxidized copper, the dielectric material is prevented from contacting the copper. In one embodiment, the sputter etch is performed by sputter etch equipment configured in situ with dielectric deposition equipment.

The present invention is better understood upon consideration of the detailed description below and the accompanying drawings.

BRIEF DESCRIPTION OF THE DRAWINGS

Use of the same reference numbers in different figures indicates similar or like elements.

DETAILED DESCRIPTION

Figure 1:
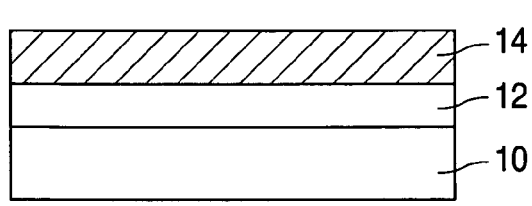
FIGS. 1 and 2 show a prior art process of forming aluminum interconnects.
Figure 2:
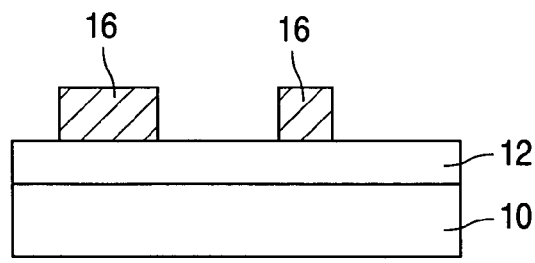
Figure 3:
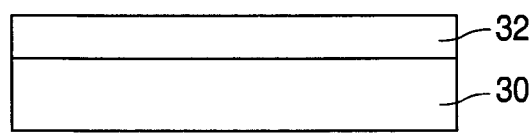
FIGS. 3-12 show a prior art double damascene technology.
Figure 4:
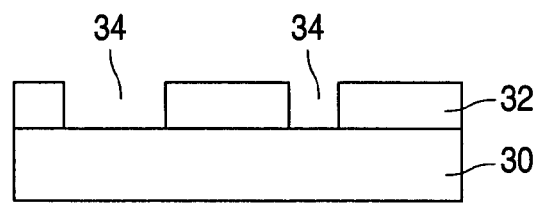
Figure 5:
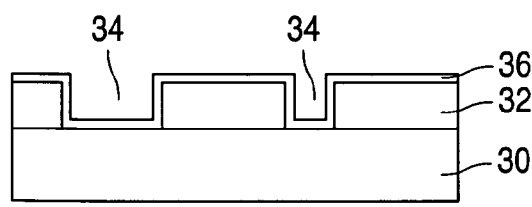
Figure 6:
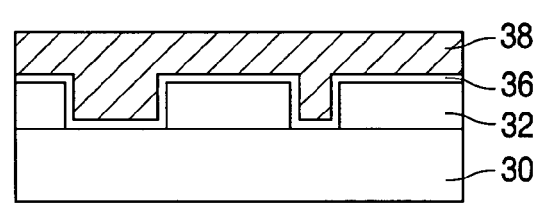
Figure 7:
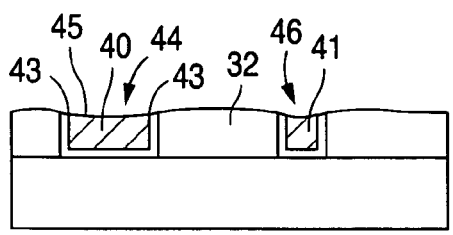
Figure 8:
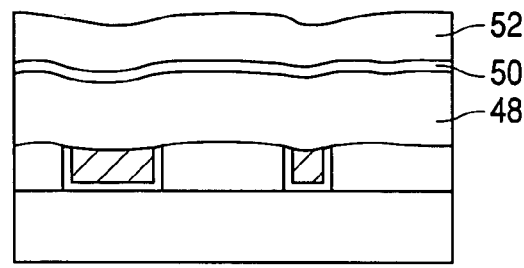
Figure 9:
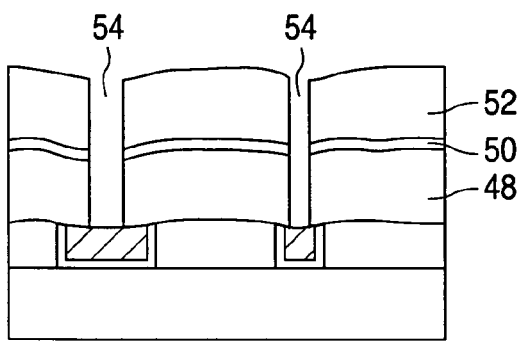
Figure 10:
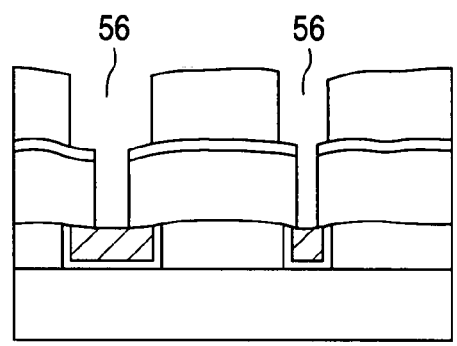
Figure 11:
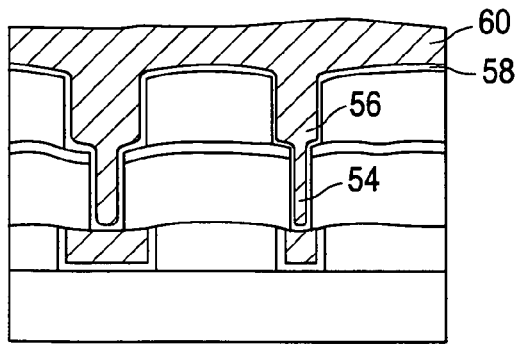
Figure 12:
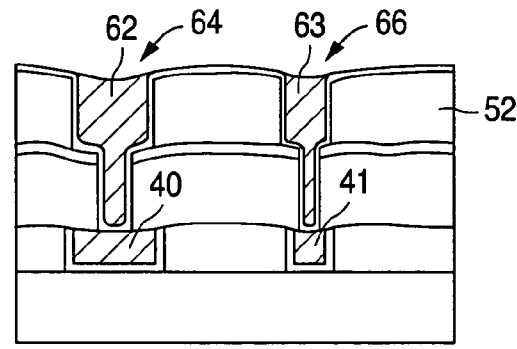
Figure 13:
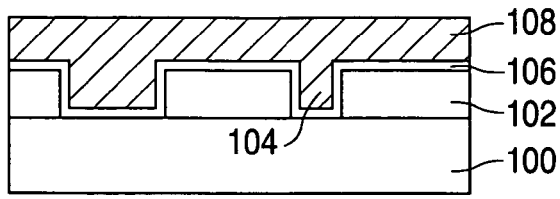
FIGS. 13 through 20 illustrate a dual-damascene process according to the present invention.

The present invention provides a method of forming interconnects that do not exhibit dishing, oxidized copper and contaminated dielectric. With reference to FIGS. 13 through 20, FIG. 13 shows a diffusion barrier 106 and a copper layer 108 deposited in sequence over a patterned dielectric layer 102 provided over a substrate 100. Substrate 100 is typically a semiconductor substrate for forming active and passive devices such as transistors, capacitors and resistors. Some examples of semiconductor substrate materials are silicon, silicon germanium, and gallium arsenide. Substrate 100 can also be a substrate used for a flat panel display.

Dielectric layer 102 is blanket deposited over substrate 100 by a well known technique, such as chemical vapor deposition (CVD). Dielectric layer 102 is made of, but not limited to, silicon dioxide ($SiO_2$). The thickness of dielectric layer 102 is generally determined by the height of the interconnect desired. The final height of the interconnect is determined in the subsequent sputter etch which is discussed later. Dielectric layer 102 typically has a thickness of 4500 Å depending on the processing environment, such as the product made and technology used.

A photoresist layer (not shown) is then formed over dielectric layer 102 and patterned to define the locations of the interconnects. The exposed portions of dielectric layer 102 are then etched to form interconnect trenches 104. After trenches 104 are formed, the photoresist layer is removed.

Next, diffusion barrier 106 is blanket deposited over patterned dielectric layer 102 and into trenches 104 to a thickness of, e.g., 300 Å. Diffusion barrier 106 prevents a subsequent copper layer from migrating into the underlying dielectric layer 102 and is made of a material such as tantalum (Ta), tantalum nitride (TaN), titanium nitride (TiN), titanium (Ti), tungsten nitride ($WN_x$), or tungsten silicide ($WSi_x$).

Copper layer 108 is blanket deposited, e.g., by an electroplating process, over diffusion barrier 106 to a thickness of, e.g., approximately 6000 Å from the top of dielectric layer 102. The process up to this point is that of a conventional damascene process.

Figure 14:
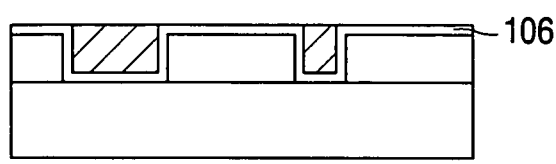

Next, referring to FIG. 14, copper layer 108 is planarized using chemical mechanical polishing (CMP) until the top of diffusion barrier 106 is exposed. The planarization is terminated at a predetermined thickness by endpoint detection specified at the CMP equipment. By stopping the CMP at diffusion barrier 106, no dishing is created by the CMP process because only copper has been processed and the CMP rate for a single material is uniform.

Figure 15:
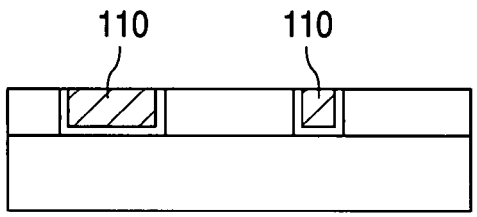

Referring to FIG. 15, the portion of diffusion barrier 106 on top of dielectric layer 102 is then removed by a sputter etch or a reactive sputter etch to form interconnects 110. The sputter etch has the advantage of having an etching rate that varies only slightly from material to material, as compared to the three times or more variation in CMP rate between the diffusion barrier and copper. Thus, diffusion barrier 106 and copper layer 108 are removed at practically the same rate during the sputter etch, resulting in interconnects 110 that exhibit no visible dishing.

Approximately 100 Å of overetch is performed to ensure complete removal of the portion of diffusion barrier 106 on top of dielectric layer 102 across the substrate. The sputter clean also removes damaged portions of the copper surface, i.e., the oxidized copper, and copper contaminants from dielectric layer 102.

In one embodiment, the sputter etch equipment is similar to conventional sputter etch equipment used for contact/via processes, for example, a sputter etch module developed by AMAT (e.g., Endura PC II based hardware). In another embodiment, the sputter etch equipment is configured in situ with dielectric deposition equipment so that the portion of barrier film 106 on top of dielectric layer 102 is removed in the sputter module and the substrate is then transferred in vacuum to the dielectric deposition module for additional layers. The sputter etch hardware may be configured in situ to allow removal of any re-deposited metal on the chamber walls.

Figure 21:
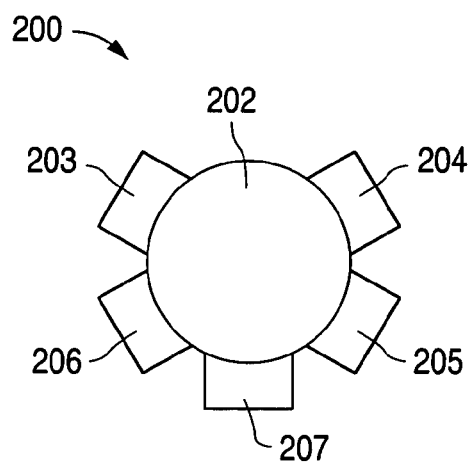
FIG. 21 shows an example of an AMAT CENTURA platform based tool having a plurality of process modules.

FIG. 21 shows an example of an AMAT CENTURA platform based tool 200 having a plurality of process modules. The process modules include a sputter etch module and several deposition modules, all integrated on one platform. As can be seen in FIG. 21, AMAT CENTURA platform based tool 200 includes a transfer chamber 202, a plurality of deposition chambers 203 through 205, a sputter clean chamber 206 and a load lock 207. A wafer is transferred between the various chambers through transfer chamber 202 under vacuum so that the wafer surface is not contaminated during wafer transfer. Deposition chambers 203 through 205 contain equipment for, for example, dielectric deposition. Sputter clean chamber 206 contains, for example, Endura PC II based hardware.

A wafer is picked from load lock 207 and transferred under vacuum through transfer chamber 202 to sputter clean module 206 for barrier removal. After completion of the sputter etch, the wafer is transferred under vacuum through transfer chamber 202 to one of the deposition chambers 203 through 205.

Figure 16:
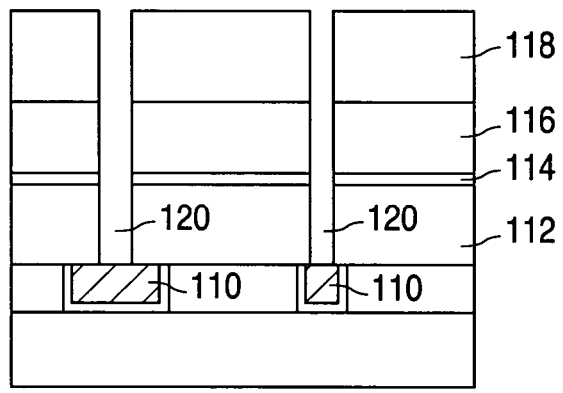

FIG. 16 shows formation of vias 120 through a dielectric layer 112, a nitride layer 114 and a dielectric layer 116 using a first mask 118. Dielectric layer 112, nitride layer 114 and dielectric layer 116 are deposited in sequence over the structure of FIG. 15. Dielectric layer 112 and dielectric layer 116 are made from materials such as silicon dioxide ($SiO_2$), phosphosilicate glass (PSG), borophosphosilicate glass (BPSG), fluorinated silicon dioxide ($F-SiO_2$) or any emerging low dielectric constant material such as, but not limited to, silk and black diamond. The thickness of dielectric layer 112 depends on the height of the contact to be formed and is typically 6000 Å. The thickness of nitride layer 114 is typically 600 Å. The thickness of dielectric layer 116 depends on the height of the interconnect to be formed and is typically 5000 Å.

A photoresist layer 118 is deposited over dielectric layer 116 and patterned to define the locations of the contacts. Dielectric layer 112, nitride layer 114 and dielectric 116 are then etched to form vias 120 over interconnects 110. Photoresist layer 118 is then removed.

Figure 17:
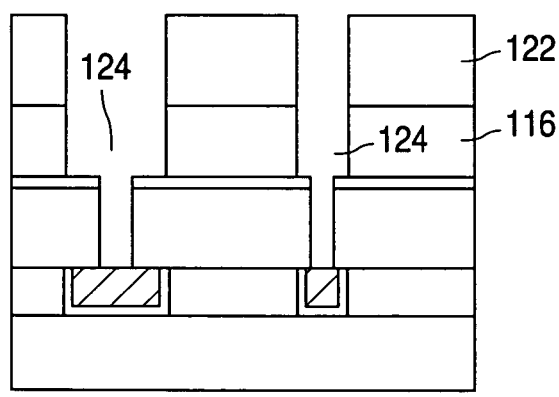

FIG. 17 shows formation of trenches 124 through dielectric layer 116 using a second mask 122. A second photoresist layer 122 is deposited over dielectric layer 116 and patterned to define the locations of the interconnects. Dielectric layer 116 is selectively etched with respect to nitride layer 114, forming trenches 124. Photoresist layer 122 is then removed.

Figure 18:
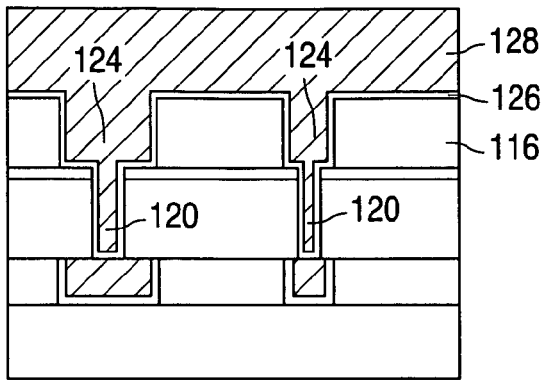
Figure 19:
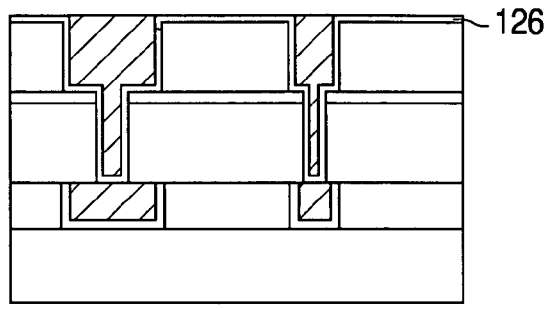
Figure 20:
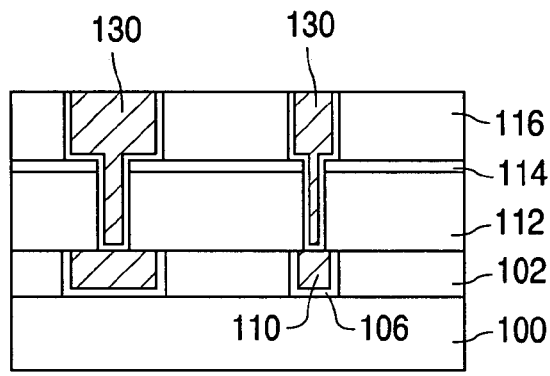

The remaining steps are similar to those described above for FIGS. 13 through 15. FIG. 18 shows deposition of a diffusion barrier 126 and a copper layer 128 over dielectric layer 116 and into trenches 124 and vias 120. FIG. 19 shows CMP of copper layer 128, with diffusion barrier 126 remaining. FIG. 20 shows formation of interconnects 130 after sputter etch to remove the portion of diffusion barrier 126 on top of dielectric layer 116, and completion of the dual damascene formation. Additional layers of interconnects may be formed in a similar manner.

The above detailed description is provided to illustrate the specific embodiments of the present invention and is not intended to be limiting. Numerous variations and modifications within the scope of the present invention are possible. The present invention is defined in the following claims.

I claim:

1. A method comprising:
providing an initial structure in which (a) a layer of first material is situated on, and in direct contact with, a primary surface of a substructure and in a principal opening, constituted as a trench, that extends from the primary surface partway through the substructure and (b) a region of second material different from the first material is situated on, and in direct contact with, the first material in the opening, the providing act comprising (i) forming the opening partway through the substructure, (ii) depositing the layer of first material on the primary surface and into the opening, and (iii) depositing the region of second material on the first material in the opening;
performing a physical sputter etch while the initial structure is in a sputter etch module to remove substantially all of the first material overlying the primary surface and above the opening and to remove part of the second material overlying the first material in the opening such that the initial structure is converted into a further structure in which remaining parts of the first and second materials are situated in the opening;
transferring the further structure from the sputter etch module to a deposition module under a substantial vacuum; and
depositing a layer of third material over the primary surface and over the parts of the first and second materials in the opening while the further structure is in the deposition module.

2. A method as in claim 1 wherein the sputter etch and deposition modules are components of processing equipment having means for transferring the further structure from the sputter etch module to the deposition module.

3. A method as in claim 1 wherein the transferring act is performed through a transfer module under the substantial vacuum.

4. A method as in claim 3 wherein the sputter etch, deposition, and transfer modules are components of processing equipment operable to connect the sputter etch module to the transfer module and to connect the transfer module to the deposition module.

5. A method as in claim 1 wherein:
the first and second materials comprise electrically conductive material; and
the third material comprises electrically insulating material.

6. A method as in claim 5 wherein the opening extends through a layer of electrically insulating material of the substructure.

7. A method as in claim 1 wherein the remaining part of the second material is considerably thicker than the remaining part of the first material in a direction generally perpendicular to the primary surface.

8. A method as in claim 1 wherein the remaining parts of the first and second materials substantially fill the opening.

9. A method as in claim 1 further including creating an additional opening through the third material down substantially to the remaining part of the second material.

10. A method as in claim 9 wherein the sputter etch and deposition modules are components of processing equipment having means for transferring the further structure from the sputter etch module to the deposition module.

11. A method as in claim 9 wherein the transferring act is performed through a transfer module under the substantial vacuum.

12. A method as in claim 11 wherein the sputter etch, deposition, and transfer modules are components of processing equipment operable to connect the sputter etch module to the transfer module and to connect the transfer module to the deposition module.

13. A method as in claim 9 wherein:
the first and second materials comprise electrically conductive material; and
the third material comprises electrically insulating material.

14. A method as in claim 9 further including introducing additional material into the additional opening.

15. A method as in claim 14 wherein the sputter etch and deposition modules are components of processing equipment having means for transferring the further structure from the sputter etch module to the deposition module.

16. A method as in claim 14 wherein the transferring act is performed through a transfer module under the substantial vacuum.

17. A method as in claim 16 wherein the sputter etch, deposition, and transfer modules are components of processing equipment operable to connect the sputter etch module to the transfer module and to connect the transfer module to the deposition module.

18. A method as in claim 14 wherein:
the first, second and additional materials comprise electrically conductive material; and
the third material comprises electrically insulating material.

19. A method as in claim 14 wherein:
the remaining parts of the first and second materials substantially fill the principal opening; and
the additional material substantially fills the additional opening.

20. A method as in claim 14 wherein the additional material comprises (a) a layer of fourth material extending substantially down to the remaining part of the second material and (b) a region of fifth material different from the fourth material and situated on the fourth material in the additional opening.

21. A method as in claim 14 wherein:
the first and fourth materials are of substantially the same chemical composition; and
the second and fifth materials are of substantially the same chemical composition.

22. A method as in claim 9 wherein the additional opening comprises a via extending down to the trench.

23. A method as in claim 9 wherein the remaining parts of the first and second materials substantially fill the principal opening.

24. A method as in claim 14 wherein the additional opening comprises a via extending down to the trench.

25. A method as in claim 14 wherein the additional opening comprises (a) a via extending down to the trench and (b) and an additional trench extending down to the via.

26. A method comprising:
providing an initial structure in which (a) a layer of first material is situated on, and in direct contact with, a primary surface of a substructure and in a principal opening that extends from the primary surface partway through the substructure and (b) a region of second material different from the first material is situated on, and in direct contact with, the first material in the opening, the providing act comprising (i) forming the opening partway through the substructure, (ii) depositing the layer of first material on the primary surface and into the opening, and (iii) depositing the region of second material on the first material in the opening, the act of depositing the region of second material includes depositing part of the second material on the layer of first material above the primary surface outside the opening;

substantially removing the part of the second material on the layer of first material above the primary surface outside the opening;

subsequently performing a physical sputter etch while the initial structure is in a sputter etch module to remove substantially all of the first material overlying the primary surface and above the opening and to remove part of the second material overlying the first material in the opening such that the initial structure is converted into a further structure in which remaining parts of the first and second materials are situated in the opening;

transferring the further structure from the sputter etch module to a deposition module under a substantial vacuum; and depositing a layer of third material over the primary surface and over the parts of the first and second materials in the opening while the further structure is in the deposition module.

27. A method as in claim 26 wherein:

prior to the act of performing the sputter etch, the portion of the layer of first material outside the opening has a largely planar upper surface; and the removing act is performed according to a procedure that causes the region of second material to have an upper surface that is largely coplanar with the upper surface of the portion of the layer of first material then outside the opening.

28. A method as in claim 27 wherein the procedure for performing the removing act comprises chemical-mechanical polishing.

* * * * *